United States Patent [19]

Miyamoto et al.

[11] Patent Number: 5,192,878
[45] Date of Patent: Mar. 9, 1993

[54] HIGH-SPEED DIFFERENTIAL AMPLIFIER

[75] Inventors: Sanpei Miyamoto; Hidetoshi Uehara, both of Tokyo, Japan

[73] Assignee: Oki Electric Industry Co., Ltd., Tokyo, Japan

[21] Appl. No.: 799,866

[22] Filed: Nov. 27, 1991

Related U.S. Application Data

[63] Continuation of Ser. No. 476,494, Jun. 7, 1990, which is a continuation of PCT/JP89/01029 filed Oct. 6, 1989 abandoned.

[30] Foreign Application Priority Data

Oct. 11, 1988 [JP] Japan .................... 63-255542

[51] Int. Cl.$^5$ .................. H03K 5/24; H03K 3/356
[52] U.S. Cl. ........................ 307/362; 307/279; 307/530
[58] Field of Search ............. 307/362, 530, 279; 330/253

[56] References Cited

U.S. PATENT DOCUMENTS

| | | | |
|---|---|---|---|
| 4,494,020 | 1/1985 | Konishi | 307/530 |
| 4,843,264 | 6/1989 | Galbraith | 307/530 |
| 4,845,675 | 7/1989 | Krenik et al. | 307/530 |
| 4,910,713 | 3/1990 | Madden et al. | 307/530 |
| 4,973,864 | 11/1990 | Nogami | 307/530 |

FOREIGN PATENT DOCUMENTS

| | | | |
|---|---|---|---|
| 2418969 | 10/1975 | Fed. Rep. of Germany | 307/530 |
| 0087911 | 5/1983 | Japan | 307/362 |
| 58-179990 | 10/1983 | Japan . | |

OTHER PUBLICATIONS

F. J. Towler, "Low Input Capacitance Sense Amplifier" IBM TDB, vol. 26, No. 7A, Dec. 1983, pp. 3124–3125.

Primary Examiner—John Zazworsky
Attorney, Agent, or Firm—Edward D. Manzo; David K. Lucente

[57] ABSTRACT

A differential amplifier compares a potential difference between a first input ($A_{in}$) and a second input ($V_r$) and provides complementary output signals (A, $\bar{A}$). The differential amplifier comprises a flip-flop (20) having nodes (N1, N2) and nodes (N3, N4) and a fixing means composed of N-channel FETs (33, 34) having drains connected to the nodes (N3, N4) of the flip-flop circuit (20) and sources connected to a second potential ($V_{SS}$) and inverters (31, 32) having inputs to which output signals (A, $\bar{A}$) are applied and outputs connected to gates of the N-channel FETs (33, 34). The fixing means detects a potential drop of the output signals (A, $\bar{A}$) and fixing the nodes (N3, N4) connected to the nodes (N1, N2) to the second potential ($V_{SS}$).

23 Claims, 3 Drawing Sheets

HIGH-SPEED DIFFERENTIAL AMPLIFIER

This is a continuation of U.S. Ser. No. 07/476,494 filed Jun. 7, 1990, which is a continuation of PCT/JP89/01029 filed Oct. 6, 1989, now abandoned.

FIELD OF THE INVENTION

The present invention relates to a differential amplifier operable dynamically for differentially amplifying two input signals in response to an active signal.

BACKGROUND OF THE INVENTION

A differential amplifier can be employed for various purposes such as translating voltages from TTL to MOS levels or in sensing signals in a memory. It may thus be used as: (1) an address buffer in a semiconductor memory for converting transistor-transistor logic (TTL) input levels of 2.4 v ("high") and 0.8 v ("low") into MOS logic levels of 5 v ("high") and 0 v ("low"); or (2) in a sense amplifier for detecting whether a signal stored in the semiconductor memory is at a high level or a low level.

An arrangement of a conventional differential amplifier as described in (1) above is illustrated in FIG. 2.

The differential amplifier differentiates potentials between a first input signal $A_{in}$ (e.g. 2.4 v or 0.8 v) and a second input signal $V_r$ (e.g. 1.5 v) in response to a high level active signal $\phi 1$ and holds a differentially determined value in response to a high level latch signal $\phi 2$. The amplifier outputs complementary output signals A, $\overline{A}$ (e.g. 5 v or 0 v) and comprises P-channel field effect transistors (FETs) 1 to 4 and N-channel FETs 5 to 13. A pair of internal nodes 14, 15 are coupled to provide the output signals A and $\overline{A}$ respectively. Shown in FIG. 2 are Vcc, which is a power supply potential (first potential), and Vss, which is a ground potential (second potential).

FIG. 3 is a waveform showing an operation of the differential amplifier of FIG. 2. As shown in FIG. 3, the active signal $\phi 1$ and the latch signal $\phi 2$ are initially at low ($V_{ss}$) level and nodes 14, 15 are respectively precharged to the power supply potential $V_{cc}$ by way of FETs 1 and 2 since these p-channel devices are on. Thus in FIG. 3, both A and $\overline{A}$ are shown initially at a high level.

When the active signal $\phi 1$ goes to high, this high voltage is coupled to the gate electrodes of p-channel FETs 1 and 2 to turn them off. The same high voltage of $\phi 1$ is applied to the gate electrodes of n-channel FETs 7 and 8 which accordingly turn on. As a result, node 15 is no longer coupled to Vcc by the source-drain path of FET 1, and is discharged by way of the source-drain paths of FETS 5, 7 and 9. Likewise, node 14 is no longer coupled to Vcc via FET 2 and is discharged by way of the source-drain paths of FETs 6, 8 and 10. Assuming that the input signal $A_{in}$ is 0.8 V and the input signal $V_r$ is 1.5 V, the conductance of the FET 10, having a gate electrode to which the input signal $V_r$ is applied and being an n-channel device, is greater than that of the FET 9 having a gate electrode to which the input signal $A_{in}$ is applied. Hence node 14 is discharged more rapidly than node 15 so that the potential of the output signal A (coupled to node 14) becomes lower than that of the output signal $\overline{A}$ (coupled to node 15), as shown in FIG. 3. The potential difference between the output signals A and $\overline{A}$ causes a conductance difference between FETs 5 and 6 since these ouput signals at nodes 14 and 15 are coupled to the gate electrodes FETs 5 and 6. If the potential of node 14 becomes lower than $V_{cc}-V_{tp}$, (where $V_{tp}$ is a threshold voltage of a p-channel FET), so that the gate voltage at FET 3 is more than one $V_{tp}$ below the source voltage, then FET 3 becomes conductive and begins to pull up its drain voltage. Since node 15 is coupled to the drain electrode of FET 3, node 15 consequently starts charging toward the power supply potential $V_{cc}$ so that the potential difference between nodes 14, 15 and hence the difference between output signals A and $\overline{A}$ is further increased, as depicted in FIG. 3.

When the latch signal $\phi 2$ coupled to the gate electrode of FET 13 goes to a high ($V_{cc}$) level, FET 13 is turned on. With node 14 low, FET 11 is off, but because node 15 is high, FET 12 is on. Node 14 is coupled then to Vss via the source-drain paths of FETs 12 and 13. Thus, FET 3 turns on harder and node 15 is pulled up to $V_{cc}$. After completion of such clamping, the output signals A and $\overline{A}$ are kept held at the level of ground potential $V_{SS}$ and power supply potential $V_{CC}$ irrespective of the change of the potentials of the input signals $A_{in}$ and $V_r$.

The conventional differential amplifier requires two control signals, namely, the active signal $\phi 1$ and the latch signal $\phi 2$ and further requires timing controls for delaying the active signal $\phi 1$ and the latch signal $\phi 2$. The conventional amplifier is liable to cause erroneous operations when the delay time of the signals $\phi 1$ and $\phi 2$ is short since the latch signal $\phi 2$ rises to high at the state where the potential difference between the output signals A and $\overline{A}$ is not substantially assured. On the contrary, the conventional amplifier is liable to cause an operation speed to delay when the delay time of the signals $\phi 1$ and $\phi 2$ is long, since it takes a long time until the output signals are latched so that the output signals may be maintained long at the levels of the input signals $A_{in}$ and $V_r$.

It is an object of the present invention to provide a differential amplifier capable of causing less erroneous operation.

It is another object of the present invention to provide a differential amplifier capable of operating at high speed.

SUMMARY OF THE INVENTION

The present invention comprises:

a flip-flop circuit having first and second nodes, first and second output terminals respectively connected to the first and the second nodes, for detecting potential change speed difference between the first node and the second node to thereby fix one of the output terminals to a first potential and the other output terminal to a second potential having a potential lower than the first potential;

a first potential change speed determining means connected to the first node and having a first input terminal for determining a potential change speed of the first node in response to a potential of a signal applied to the first input terminal;

a second potential change speed determining means connected to the second node and having a second input terminal for determining a potential change speed of the second node in response to a potential of a signal applied to the second input terminal;

a first potential fixing means connected between the first node and the first output terminal for fixing the first node to the second potential when the potential of the first output terminal is less than that of the first potential for a fixed value; and a second potential fixing means connected between the second node and the second output terminal for fixing the second node to the second potential when the potential of the second output terminal is less than that of the first potential for a fixed value.

DETAILED DESCRIPTION OF THE PRESENTLY PREFERRED EMBODIMENT

The present invention will be described further with reference to FIG. 1 and FIGS. 4 to 6.

Figure 1:
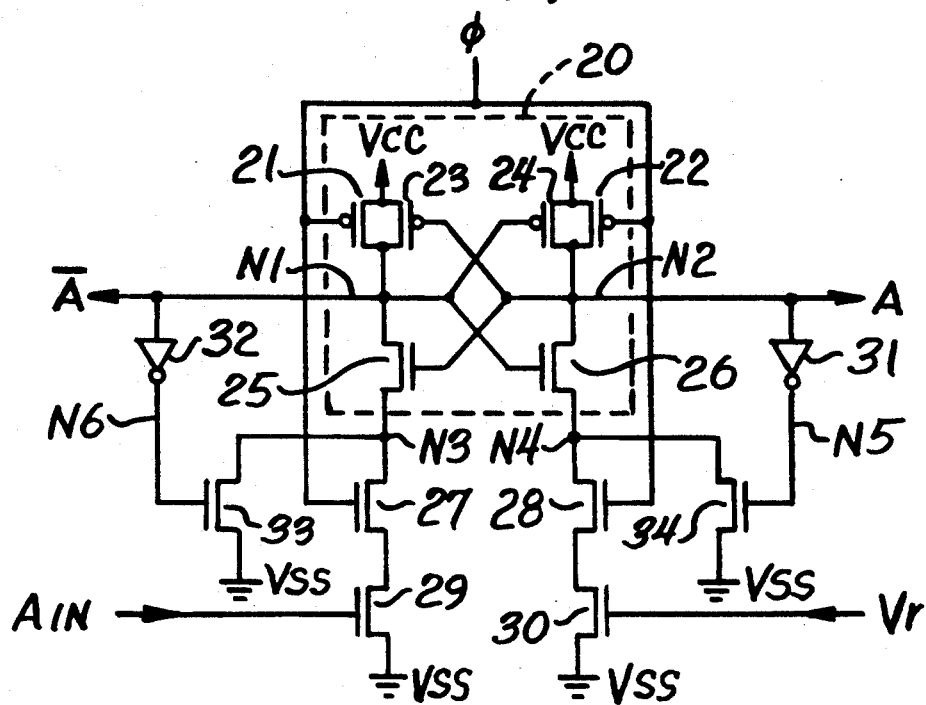
FIG. 1 is a circuit diagram showing a differential amplifier according to a first embodiment of the present invention.
Figure 2:
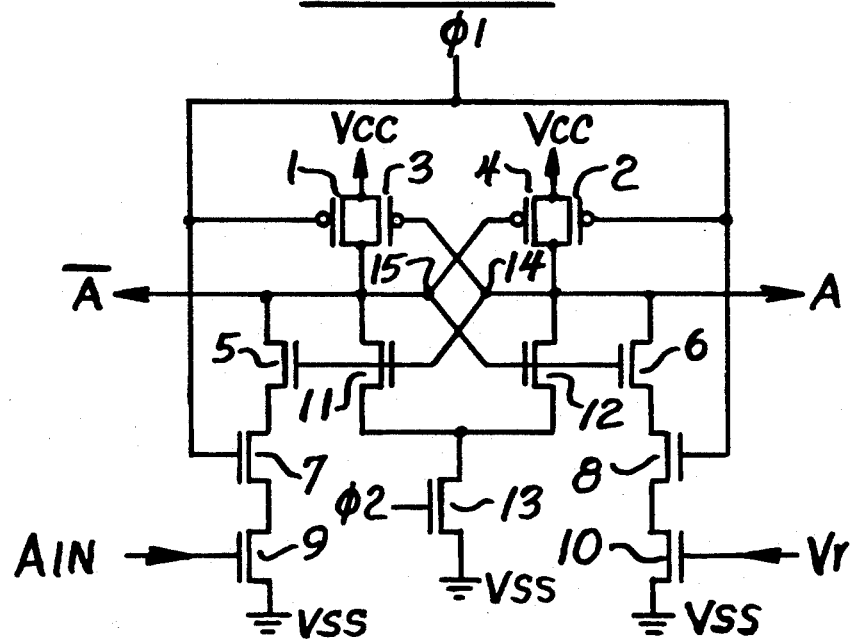
FIG. 2 is a circuit diagram showing a conventional differential amplifier.
Figure 3:
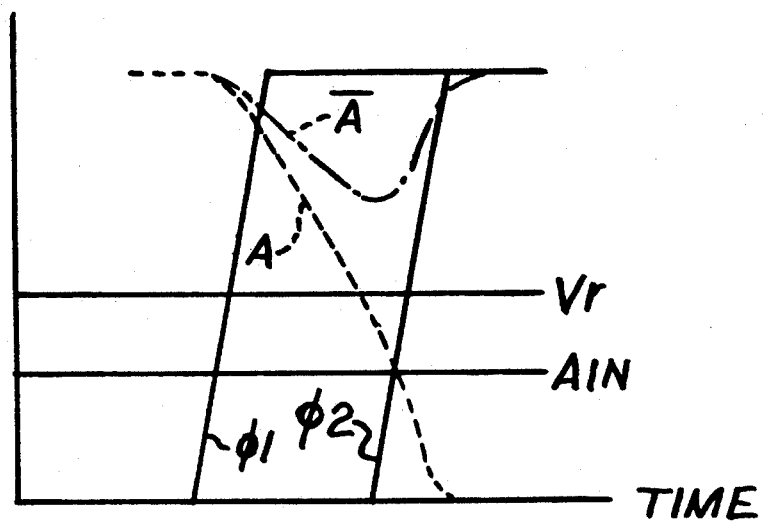
FIG. 3 is a waveform showing an operation of FIG. 2.

FIG. 1 is a circuit diagram of a differential amplifier of a dynamic type according to the first embodiment of the present invention. The differential amplifier detects a potential difference between a first input signal $A_{in}$ (e.g. 2.4 V or 0.8 V) and a second input signal $V_r$ (e.g. 1.5 V) in response to a high level of an active signal $\phi$ and provides complementary fixed output signals (e.g. 5 V and 0 V) on the basis of the different magnitudes or values between the first input signal $A_{in}$ and the second input signal $V_r$. The differential amplifier comprises a flip-flop circuit 20 (hereinafter referred to as FF circuit), N-channel transistors 27 to 30, 33, 34 and inverters 31, 32. The FF circuit 20 has P-channel FETs 21 to 24 and N-channel FETs 25, 26 in which sources of the parallel connected P-channel FETs 21, 23 are commonly connected to a power supply potential $V_{CC}$ as a first potential and drains thereof are commonly connected to a first output node N1. A drain of the N-channel FET 25 is connected to the first output node N1, and a source of the N-channel FET 25 is connected to a first node N3. Similarly, the P-channel FETs 22, 24 are connected in parallel between the power supply potential $V_{CC}$ and a second output node N2, and the N-channel FET 26 is connected between the second output node N2 and a second node N4. A gate electrode of the P-channel FET 23 and a gate electrode of the N-channel FET 25 are commonly connected to the second output node N2. A gate electrode of the P-channel FET 24 and a gate electrode of the N-channel FET 26 are commonly connected to the first output node N1.

The active signal $\phi$ is commonly applied to gate electrodes of the P-channel FETs 21, 22. Drains of the N-channel FETs 27, 28 are connected to the first and second nodes N3, N4, and the active signal $\phi$ is applied to gate electrodes of the FETs 27, 28. Sources of the N-channel FETs 27, 28 are connected to drains of the FETs 29, 30. Sources of the FETs 29, 30 are respectively connected to the ground potential $V_{SS}$ as the second potential. Drains of N-channel FETs 33, 34 are connected to the first and the second nodes N3, N4, and sources of the FETs 33, 34 are respectively connected to the ground potential $V_{SS}$. Gates of the FETs 33, 34 are connected to outputs of inverters 32, 31. Inputs of the inverters 32, 31 are connected to the first and the second output nodes N1, N2. The output signals A, $\overline{A}$ are supplied by to the output nodes N1, N2. The input signals $A_{in}$, $V_r$ are applied to gate electrodes of the N-channel FETs 29, 30. A potential setting means comprises the inverter 31, the FET 34 and the inverter 32, the FET 33. Thus, nodes N3 and N4 are selectively coupled to $V_{SS}$ via the source-drain paths of n-channel FETs 33, 34.

Figure 4:
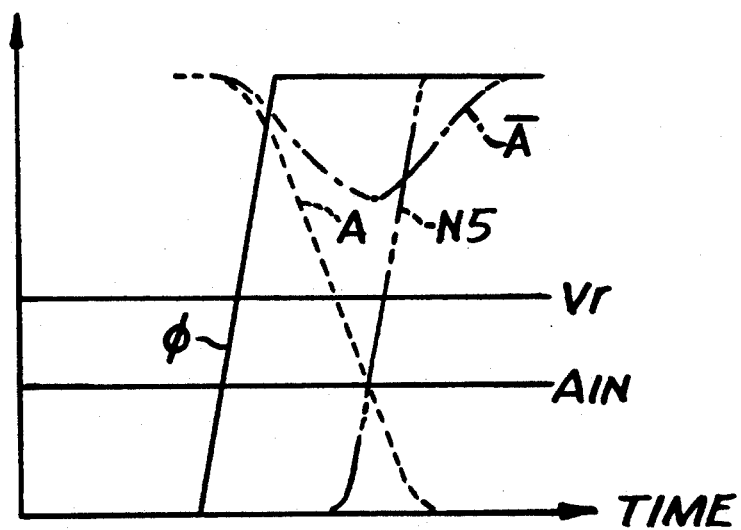
FIG. 4 is a waveform showing an operation of FIG. 1.

An operation of the differential amplifier according to the first embodiment will be described with reference to a waveform of an operation as illustrated in FIG. 4.

The active signal $\phi$ is initially at a low level (=$V_{SS}$ level), hence the FETs 21, 22 are turned on. Accordingly, nodes N1 and N2 and thus the output signals A, $\overline{A}$ are precharged to the power supply potential $V_{CC}$ by way of the FETs 21, 22.

FIG. 4 shows both A and $\overline{A}$ initially at these high levels. Note also that input voltage Vr is higher than input voltage Ain. Also, it will be understood that because nodes N1 and N2 are high, so too are n-channel FETs 25, 26 on.

When the active signal $\phi$ goes to a high level (=$V_{CC}$ level), the FETs 21, 22 turn off, but n-channel FETs 27, 28 are turned on. Since the input signals are positive, FETs 29 and 30 are not off completely. Thus node N1 with output signal $\overline{A}$ is discharged by way of the FETs 25, 27, 29 and at the same time node N2 with output signal A is discharged by way of the FETs 26, 28, 30. Assuming that the input signal $A_{in}$ is 0.8 V and the input signal $V_r$ is 1.5 V, the conductance of the FET 30, having the gate to which the input signal $V_r$ is applied, is greater than the conductance of the FET 29 having the gate to which the input signal $A_{in}$ is applied. Accordingly, the output signal A is discharged more quickly than the output signal $\overline{A}$ as shown in FIG. 4. The potential of the output signal A drops lower than that of the output signal $\overline{A}$. The potential difference between nodes N1 and N2 means that there is a conductance difference between the FETs 25, 26. When the potential of node N2 drops lower than $V_{CC}-V_{tp}$, the FET 23 is turned on. Thus node N1 is pulled toward the power supply potential $V_{CC}$ by way of the FET 23 whereby the potential difference of the output signals A, $\overline{A}$ is increased further. This is shown in FIG. 4 where $\overline{A}$, having dipped in voltage, rises back to its initial level.

When the potential of the output signal A (node N2) drops below the threshold voltage of the inverter 31, a node N5 at the output side of the inverter 31 goes to a high level so that n-channel FET 34 is turned on to couple node N4 to Vss. Since FET 26 is gated by N1, it is on, and the output signal A at N2 is clamped to the ground potential $V_{SS}$ by way of the source drain paths of FETs 26, 34. The FET 23 is turned on harder by the continuing potential decrease of the output signal A at node N2 so that the output signal $\overline{A}$ is clamped more firmly to the power supply potential $V_{CC}$ by way of the p-channel FET 23. At this state a node N6 at the output side of the inverter 32 is at a low level, hence the FET 33 is not turned on. After the output signals A, $\overline{A}$ are clamped, the output signals A, $\overline{A}$ are held at the potential levels $V_{SS}$ and $V_{CC}$ irrespective of the changes of the input potentials.

Thereafter, when the active signal $\phi$ goes to a low level, the operation of the differential amplifier returns to its original state. When $A_{in}$ is applied to the first input with a greater potential then $V_r$, the output signal A goes to a high level ($=V_{CC}$ level) and the output signal $\overline{A}$ goes "L" level ($=V_{SS}$ level) as set forth above.

It is preferable to set the threshold voltages of the inverters 31, 32 at a substantially middle value between the first potential ($V_{CC}$) and the second potential ($V_{ss}$). The reason for this is that if the threshold voltages of the inverters 31, 32 are close to the first potential ($V_{CC}$), there is a high possibility that the output signal is clamped by erroneous operation, and if the threshold voltages are close to the second potential ($V_{SS}$), it takes a long time to clamp the output signal.

The first embodiment has the following advantage. Inasmuch as the latch control is effected by inverting the output signals $\overline{A}$, A via inverters 31, 32, an external latch signal such as $\phi 2$ is not necessary, and the differential amplifier is operative only by the active signal $\phi$. Therefore, it eliminates the timing of the other control signal which goes to a high level upon lapse of a predetermined time after the active signal $\phi$ goes to a high level so that an erroneous operation will be prevented, and the differential amplification will be achieved at high speed.

Figure 5:
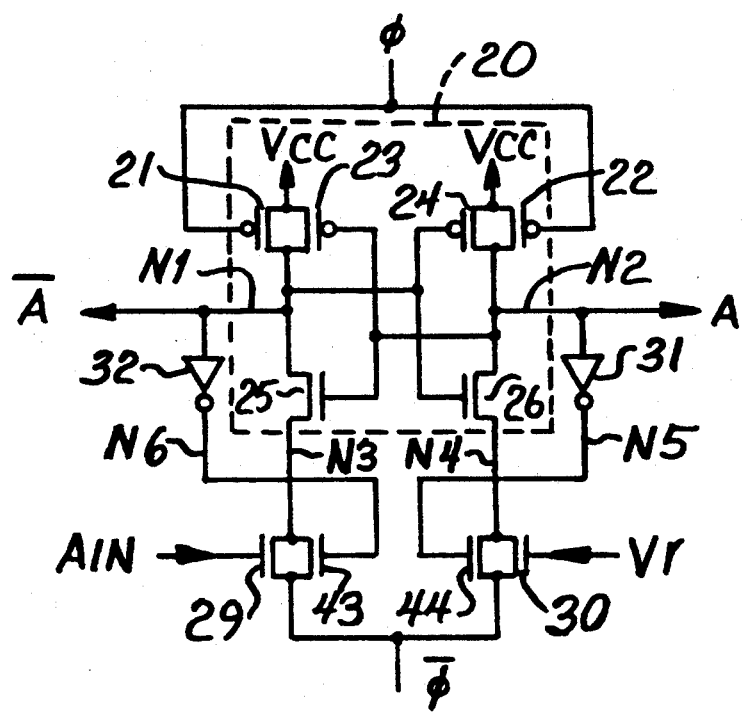
FIG. 5 is a circuit diagram showing a differential amplifier according to a second embodiment of the present invention.

A second embodiment of the present invention will be described with reference to FIGS. 5 and 6. FIG. 5 is a circuit diagram showing a differential amplifier of the second embodiment of the present invention in which those elements which are the same as those in FIG. 1 are designated with the same numerals and the explanation thereof is omitted. In the differential amplifier, an inverse active signal $\overline{\phi}$ is employed instead of the ground potential $V_{SS}$ as the second potential in the first embodiment and the FETs 27, 28 are omitted. Furthermore, the FETs 33, 34 are connected in parallel to the FETs 29, 30 and relabeled as FETs 43, 44.

Figure 6:
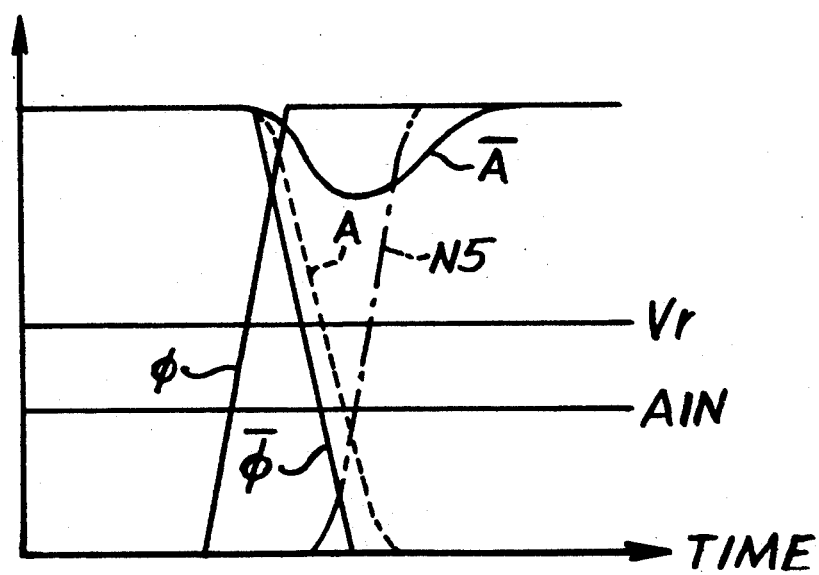
FIG. 6 is a waveform showing an operation of FIG. 5.

An operation of the differential amplifier according to the second embodiment will be described with reference to a waveform of an operation as illustrated in FIG. 6.

When the active signal $\phi$ goes to a high level from a low level, the inverse active signal $\overline{\phi}$ goes to a low level from the a high level so that the output signal at node N2 A is discharged by way of the FETs 26, 30 and at the same time the output signal $\overline{A}$ at node N1 is discharged by way of the FETs 25, 29. Assuming that the input signal $A_{in}$ is 0.8 V and the input signal $V_r$ is 1.5 V, as in the first embodiment, the conductance of the FET 30 is greater than that of the FET 29 so that the output signal A at node N2 is discharged more quickly than the output signal $\overline{A}$ at node N1 whereby the potential of the output signal A becomes lower than that of the output signal $\overline{A}$. Since there is a potential difference between the output signals A, $\overline{A}$, there is a conductance difference between the FETs 25, 26. Hence, the difference in the discharging speed between the output signals A, $\overline{A}$ is increased. When the potential of the output signal A becomes less than $V_{CC}-V_{tp}$, the FET 23 is turned on and the output signal $\overline{A}$ starts to pull up node N1 so that the potential difference between the output signals A, $\overline{A}$ is increased. When the potential of the output signal A drops below the threshold voltage of the inverter 31, the output thereof goes to a high level to thereby turn on the FET 44. Accordingly, the output signal A is clamped to $\overline{\phi}$ at a low level and the output signal $\overline{A}$ is clamped to the potential $V_{CC}$.

According to the second embodiment set forth above, although the active signal $\phi$ and the inverse active signal $\overline{\phi}$ are necessary, the timing control of the signals, having an inverse relationship, can be effected with ease (e.g. can be made by one inverter) so that the potential difference can be reduced, as in the first embodiment. Furthermore, there is an advantage that two FETs are omitted according to the second embodiment compared with the first embodiment.

It will be understood from the foregoing description that a first "potential determining circuit" and a first "potential defining circuit" may be constituted by FETs 27 and 29. A second "potential determining circuit" and a second "potential defining circuit" may be constituted of FETS 28 and 30. A "potential detecting circuit" may be constituted by inverter 32. A "voltage detection circuit" may be constituted by inverter 32 and FET 33. A second "voltage detection circuit" may be constituted by inverter 31 and FET 34. A "pull down" circuit may be constituted by FETs 27~30. A further "pull down" circuit may be constituted by FET 33 or 34. A voltage sensing circuit may be constituted by inverter 31 or 32. A "pull up" transistor may be constituted by FET 21 or 22. The terms "pull up" and "pull down" are believed to be well recognized in the art.

As mentioned above in detail, inasmuch as the latch control can be effected when the output signal is less than a fixed potential according to the present invention, an external latch signal is unnecessitated which eliminates a minute timing control between the active signal and the latch signal. Accordingly, it is possible to stably differentiate the amplification without erroneous operation and with a simple control at high speed.

We claim:
1. A differential amplifier comprising:
first, second, third and fourth nodes;
a first transistor of a first conductivity type having a first control electrode coupled to the first node, said first transistor being coupled between the second node and a source of a first potential;
a second transistor of the first conductivity type having a second control electrode coupled to the second node, the second transistor being coupled between the first potential source and the first node;
a third transistor of a second conductivity type having a third control electrode coupled to the second node, the third transistor being coupled between the first node and the third node;
a fourth transistor of the second conductivity type having a fourth control electrode coupled to the first node, the fourth transistor being coupled between the second node and the fourth node;
a first potential defining circuit, having a first input terminal and being coupled to the third node, for defining a potential of the first node in response to a signal applied to the first input terminal;
a second potential defining circuit, having a second input terminal and being coupled to the fourth node, for defining a potential of the second node in response to a signal applied to the second input terminal;
a fifth transistor having a fifth control electrode and being coupled to a source of a second potential and to the third node; and
a potential detecting circuit for detecting the potential of the first node and causing the fifth transistor to be conductive when the potential of the first node is less than a middle potential between the first potential and the second potential.

2. A differential amplifier according to claim 1 wherein the first transistor and the second transistor are p-channel FETs, and the third transistor and the fourth transistor are n-channel FETs.

3. A differential amplifier according to claim 1 wherein the first potential defining circuit comprises a sixth transistor having a sixth control electrode coupled to the first input terminal, the sixth transistor being coupled between the second potential source and the third node.

4. A differential amplifier according to claim 3 wherein the sixth transistor is an n-channel FET.

5. A differential amplifier according to claim 3 wherein the second potential defining circuit comprises a seventh transistor having a control electrode coupled to the second input terminal, and being coupled between the second potential source and the fourth node.

6. A differential amplifier according to claim 5 wherein said transistor of said second potential defining circuit is an n-channel FET.

7. A differential amplifier according to claim 1 wherein said potential detecting circuit comprises an inverter having an input terminal coupled to the first node and an output terminal coupled to the fifth control electrode.

8. A differential amplifier according to claim 5 further comprising:
an eighth transistor coupled between the third node and the sixth transistor and having a control electrode to which an active signal is applied; and
a ninth transistor coupled between the fourth node and the seventh transistor and having a control electrode to which the active signal is applied.

9. A differential amplifier according to claim 8 wherein said eighth and ninth coupling transistors are n-channel FETs.

10. A differential amplifier according to claim 8 further comprising:
a tenth transistor coupled between the first potential source and the first node, and having a control electrode to which the active signal is supplied; and
an eleventh transistor coupled between the first potential source and the second node, and having a control electrode to which the active signal is applied.

11. A differential amplifier according to claim 10 wherein said tenth and eleventh transistors are p-channel FETs.

12. A differential amplifier according to claim 10 further comprising:
a twelfth transistor having a control electrode and being coupled between said second potential source and said fourth node; and
another potential detecting circuit for detecting the potential of the second node and causing said twelfth transistor to be conductive when the potential of the second node is less than the middle potential of the first potential and the second potential.

13. A differential amplifier according to claim 12 wherein said another potential defining circuit comprises an inverter having an input terminal coupled to the second node and having an output terminal coupled to the control electrode of said twelfth transistor, 14. An integrated circuit differential amplifier comprising:
a flip flop having cross-coupled first and second p channel transistors and cross-coupled n channel transistors, each having a respective path of controllable conductivity and a control electrode;
first and second nodes within said flip flop, the first node being coupled to control electrodes of said second p channel transistor and said second n channel transistor, the second node being coupled to control electrodes of said first p channel transistor and said first n channel transistor, said first and second nodes providing output signals from the differential amplifier;
said flip flop being coupled to receive a source of operating voltage;
said flip flop having third and fourth nodes;
a first potential defining circuit, having a first input terminal and being coupled to the third node for defining a potential of the first node in response to a first signal applied to the first input terminal;
a second potential defining circuit, having a second input terminal and being coupled to the fourth node, for defining a potential of the second node in response to a second signal applied to the second input terminal;
a voltage detection circuit coupled to said first node and coupling said third node to a source of second voltage in response to detecting a voltage on said first node that is between the operating voltage and said second voltage.

15. The amplifier of claim 14 further comprising a second voltage detection circuit coupled to said second node.

16. The amplifier of claim 14 wherein said voltage detection circuit includes:
an inverter having an input coupled to said first node; and
a transistor responsively coupled to an output of said inverter,
said transistor having a path of controllable conductivity coupled between said source of second voltage and said third node.

17. The amplifier of claim 14 further including:
third and fourth p-channel transistors, the third p-channel transistor coupled between said source of operating voltage and the first node, the fourth p channel transistor coupled between said source of operating voltage and the second node;
an input coupled to receive an active control signal, said input coupling said control signal to control electrodes of said third and fourth p-channel transistors.

18. The amplifier of claim 14 wherein the first potential defining circuit comprises a third n channel transistor having a control electrode coupled to the first input terminal to which the first input signal is applied, and the second potential defining circuit comprises a fourth n channel transistor having a control electrode coupled to the second input terminal to which the second input signal is applied.

19. The amplifier of claim 18 further comprising:
a fifth n channel transistor coupled between the third node and said first potential defining circuit and having a control electrode to which an action signal is applied; and
a sixth n channel transistor coupled between the fourth node and said second potential defining circuit and having a control electrode to which the active signal is applied.

20. A differential amplifier comprising:

a flip flop having transistors and a pair of nodes therein;

a pair of output terminals coupled to said nodes, respectively;

a potential defining circuit coupled to the flip flop, for receiving input signals and defining voltages on said nodes based on input signals;

a potential detecting circuit coupled to one of said nodes; and a pull down circuit responsively coupled between said potential detecting circuit and said flip flop.

21. The amplifier of claim 20 further including:

a precharge circuit having a pair of pull up transistors and configured to pull up a voltage potential on said nodes in response to a control signal.

22. A differential amplifier for an intergrated circuit comprising:

first, second, third and fourth nodes;

a first transistor of a first conductivity type having a first control electrode coupled to the first node, said first transistor being coupled between the second node and a source of a first potential;

a second transistor of the first conductivity type having a second control electrode coupled to the second node, the second transistor being coupled between the first potential source and the first node;

a third transistor of a second conductivity type having a third control electrode coupled to the second node, the third transistor being coupled between the first node and the third node;

a fourth transistor of the second conductivity type having a fourth control electrode coupled to the first node, the fourth transistor being coupled between the second node and the fourth node;

a fifth transistor having a fifth control electrode and being coupled to a source of a second potential and to the third node;

a first potential defining circuit, having a first input terminal and being coupled to the third node, for defining a potential of the first node in response to a signal applied to the first input terminal, the first potential defining circuit comprising a sixth transistor having a sixth control electrode coupled to the first input terminal, the sixth transistor being coupled between the second potential source and the third node;

a second potential defining circuit, having a second input terminal and being coupled to the fourth node, for defining a potential of the second node in response to a signal applied to the second input terminal, the second potential defining circuit comprising a seventh transistor having a seventh control electrode coupled to the second input terminal, and being coupled between the second potential source and the fourth node;

an eighth transistor coupled between the third node and said first potential defining circuit and having an eighth control electrode to which an active signal is applied;

a ninth transistor coupled between the fourth node and the second potential defining circuit and having a ninth control electrode to which the active signal is applied;

a tenth transistor coupled between the first potential source and the first node, and having a tenth control electrode to which said active signal is supplied;

an eleventh transistor coupled between the first potential source and the second node, and having an eleventh control electrode to which the active signal is applied;

a twelfth transistor having a twelfth control electrode and being coupled between said second potential source and said fourth node;

a first potential detecting circuit for detecting the potential of the first node and causing the fifth transistor to be conductive when the potential of the first node is less than a middle potential between the first potential and the second potential, said first potential detecting circuit comprising an inverter having an input terminal coupled to the first node and an output terminal coupled to the fifth control electrode; and a second potential detecting circuit for detecting the potential of the second node and causing said twelfth transistor to be conductive when the potential of the second node is less than the middle potential between the first potential and the second potential.

23. A differential amplifier according to claim 22 wherein said second potential detecting circuit comprises an inverter having an input terminal coupled to the second node and having an output terminal coupled to the control electrode of said twelfth transistor.

* * * * *